United States Patent
Jaggers et al.

(10) Patent No.: US 11,880,248 B2
(45) Date of Patent: Jan. 23, 2024

(54) SECONDARY EXTERNAL COOLING FOR MOBILE COMPUTING DEVICES

(71) Applicant: ADVANCED MICRO DEVICES, INC., Santa Clara, CA (US)

(72) Inventors: Christopher M. Jaggers, Austin, TX (US); Christopher M. Helberg, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 17/486,430

(22) Filed: Sep. 27, 2021

(65) Prior Publication Data

US 2023/0095467 A1 Mar. 30, 2023

(51) Int. Cl.
G06F 1/20 (2006.01)
G06F 1/16 (2006.01)
H05K 7/20 (2006.01)

(52) U.S. Cl.
CPC ............ G06F 1/203 (2013.01); G06F 1/1632 (2013.01); G06F 2200/201 (2013.01); H05K 7/20254 (2013.01)

(58) Field of Classification Search
CPC ............ H05K 7/20263; H05K 7/20254; G06F 1/182; G06F 1/203; G06F 1/1632; G06F 2200/201
See application file for complete search history.

(56) References Cited

U.S. PATENT DOCUMENTS

| | | | | |
|---|---|---|---|---|
| 5,704,212 A * | 1/1998 | Erler | ...................... | F25B 21/04 361/679.48 |
| 6,084,769 A * | 7/2000 | Moore | .................... | G06F 1/203 361/679.52 |
| 6,118,654 A * | 9/2000 | Bhatia | .................... | G06F 1/1632 361/679.55 |
| 6,276,448 B1 * | 8/2001 | Maruno | .............. | F28D 15/0275 257/E23.101 |
| 6,362,959 B2 * | 3/2002 | Tracy | .................... | G06F 1/1632 361/689 |
| 6,445,580 B1 * | 9/2002 | Cohen | ..................... | H01L 23/38 361/679.47 |
| 6,453,378 B1 * | 9/2002 | Olson | ..................... | G06F 1/203 361/679.55 |
| 6,646,874 B2 * | 11/2003 | Pokharna | ................ | G06F 1/203 361/679.48 |
| 6,837,057 B2 * | 1/2005 | Pokharna | ................ | G06F 1/203 361/679.48 |
| 6,966,358 B2 * | 11/2005 | Rapaich | ................ | G06F 1/1632 257/E23.098 |
| 7,375,967 B2 * | 5/2008 | Huang | .................. | G06F 1/1632 361/679.48 |
| 7,548,427 B2 * | 6/2009 | Mongia | ................... | G06F 1/206 165/80.4 |
| 10,401,925 B2 * | 9/2019 | Uchino | .................. | G06F 1/1632 |
| 11,409,340 B2 * | 8/2022 | Shen | ....................... | G06F 1/203 |

(Continued)

*Primary Examiner* — Michael A Matey

(57) ABSTRACT

A docking station for secondary external cooling for mobile computing devices, including: one or more ports for docking a mobile computing device; a docking platform for supporting the mobile computing device; a cooling element; and a thermal interface housed in the docking platform for transferring heat between the mobile computing device and the cooling element.

20 Claims, 5 Drawing Sheets

(56) References Cited

U.S. PATENT DOCUMENTS

| | | | | |
|---|---|---|---|---|
| 2004/0008483 | A1* | 1/2004 | Cheon | G06F 1/20 |
| | | | | 361/699 |
| 2008/0052428 | A1* | 2/2008 | Liang | G06F 1/206 |
| | | | | 710/62 |
| 2009/0113105 | A1* | 4/2009 | Mok | G06F 1/3203 |
| | | | | 710/304 |
| 2010/0008036 | A1* | 1/2010 | Risher-Kelly | G06F 1/1632 |
| | | | | 62/3.3 |
| 2012/0236501 | A1* | 9/2012 | Nagasawa | G06F 1/206 |
| | | | | 165/185 |
| 2014/0352926 | A1* | 12/2014 | Sun | G06F 1/203 |
| | | | | 165/104.26 |
| 2015/0327400 | A1* | 11/2015 | Wang | G06F 1/1632 |
| | | | | 361/696 |
| 2017/0020032 | A1* | 1/2017 | Wang | G06F 1/203 |
| 2017/0055367 | A1* | 2/2017 | Shen | G06F 1/1626 |
| 2017/0153678 | A1* | 6/2017 | Uchino | G06F 1/1632 |
| 2018/0284855 | A1* | 10/2018 | North | G06F 1/203 |
| 2019/0324507 | A1* | 10/2019 | Carbone | H05K 7/20336 |
| 2021/0191461 | A1* | 6/2021 | Jaggers | G06F 1/1632 |

\* cited by examiner

# SECONDARY EXTERNAL COOLING FOR MOBILE COMPUTING DEVICES

BACKGROUND

Computing devices implement one or more cooling elements to transfer and dissipate heat generated by various components, including processors, graphics processing units (GPUs), and the like. Such cooling elements include, for example, fluid-cooled systems, heat pipes, vapor chambers, heat sinks, fans, and the like.

DETAILED DESCRIPTION

Figure 1:
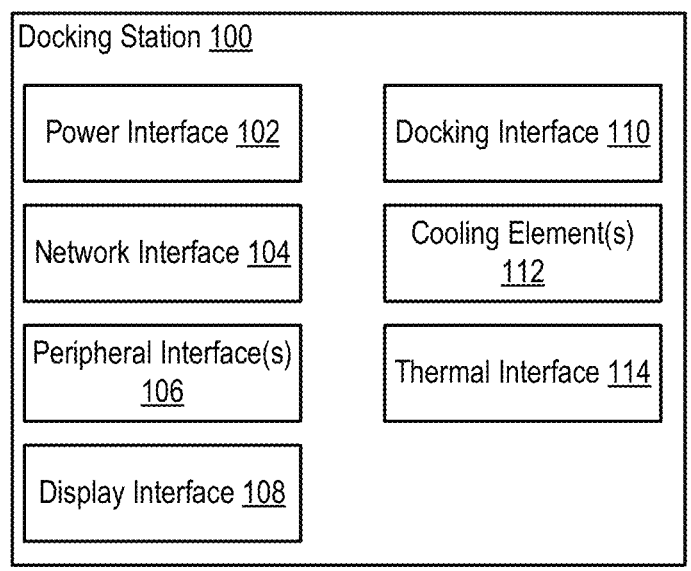
FIG. 1 is a block diagram of an example docking station for secondary external cooling for mobile computing devices according to some implementations.

For mobile computing devices (e.g., laptops, tablets, hybrid laptop/tablets, and the like), the amount of internal space available for components is limited. Accordingly, the amount of internal space available for cooling elements is restricted, thereby limiting the overall amount of cooling available to the mobile computing device.

Due to the restricted cooling available to mobile computing devices, performance enhancement techniques that result in increased heat generation are restricted from or unavailable to the mobile computing device. For example, overclocking a processor results in an increased operating frequency of the processor, but requires an increased voltage to be supplied to the processor. Such an increase in voltage will also increase the amount of heat generated by the processor, thereby increasing the amount of heat to be dissipated by the internal cooling systems. Accordingly, a mobile device is limited in the degree to which processors or other components are able to be overclocked due to the increased cooling requirements.

Mobile devices may be used in conjunction with docking stations that allow simplified interfacing between the mobile computing device and other peripheral devices. As would be appreciated by one skilled in the art, a docking station for a mobile computing device is an apparatus that includes various ports and interfaces, including ports for displays, peripheral input devices, wired network ports, and the like. A mobile computing device coupled to the docking station is able to use the peripheral devices, displays, and network connections of the docking station. The mobile computing device is typically coupled to the docking station using a single connection interface to allow the mobile computing device to be easily coupled and decoupled from the docking station. Though docking stations allow for simplified coupling and decoupling for peripheral devices, and also expand the peripheral devices available for use with a given mobile computing device, the docking stations do not expand or enhance the cooling capabilities of the mobile computing device.

To that end, implementations according to the present disclosure include a docking station for secondary external cooling for mobile computing devices. Such a docking station includes one or more ports for docking a mobile computing device, a docking platform for supporting the mobile computing device, a cooling element, and a thermal interface housed in the docking platform for transferring heat between the mobile computing device and the cooling element.

In some implementations, the cooling element includes a thermoelectric cold plate. In some implementations, the thermal interface includes a surface of the thermoelectric cold plate. In some implementations, the cooling element includes a liquid-cooled cooling element. In some implementations, the liquid-cooled cooling element forms a liquid-to-liquid heat exchanger with the docked mobile computing device, the docked mobile computing device including another liquid-cooled cooling element. In some implementations, the docking station further includes one or more fans providing air flow through the docking platform. In some implementations, the thermal interface comprises a metal contact plate.

In some implementations, a mobile computing device that is configured for secondary external cooling includes a first cooling element and a thermal interface port. In such implementations, the mobile computing device is configured to thermally couple the first cooling element to a second cooling element of a docking station via the thermal interface port.

In some implementations of the mobile computing device configured for secondary external cooling, the thermal interface port exposes the first cooling element to a thermal interface of the docking station. In some implementations, the thermal interface port exposes a thermal interface housed in a chassis of the mobile computing device. In some implementations, the thermal interface includes a metal plate. In some implementations, the first cooling element includes a first liquid-cooled cooling element. In some implementations, the second cooling element comprises a second liquid-cooled cooling element. In some implementations, the first cooling element forms a liquid-to-liquid heat exchanger with the second cooling element and a thermal interface. In some implementations, the thermal interface port includes a removable panel or a movable panel. In some implementations, the mobile computing device also includes one or more vents that are aligned with one or more fans of the docking station.

Implementations of the present disclosure also include a method for secondary external cooling for mobile computing devices. Such methods include detecting docking of a mobile computing device to a docking station, where the docking includes thermally coupling a first cooling element of the docking station to a second cooling element of the mobile computing device. Secondary external cooling for mobile computing devices also includes modifying one or more operating parameters of the mobile computing device responsive to the detection of the docking.

In some implementations, modifying one or more operating parameters includes modifying, in response to the mobile computing device being docked with the docking station, one or more maximum safe operational voltages of the mobile computing device.

In some implementations, the first cooling element, the second cooling element, and the thermal interface form a liquid-to-liquid heat exchanger. In some implementations, the first cooling element includes a thermoelectric cold plate.

Computing devices implement one or more cooling elements to transfer and dissipate heat generated by various components, including processors, graphics processing units (GPUs), and the like. Such cooling elements include, for example, fluid-cooled systems (e.g., water-cooled systems), heat pipes, vapor chambers, heat sinks, fans, and the like. For mobile computing devices (e.g., laptops, tablets, hybrid laptop/tablets, and the like), the amount of internal space available for components is limited. Accordingly, the amount of internal space available for cooling elements is restricted, thereby limiting the overall amount of cooling available to the mobile computing device.

FIG. 1 is a block diagram of a non-limiting example docking station 100 for secondary external cooling for mobile computing devices according to implementations of the present disclosure. The example docking station 100 includes a power interface 102. The power interface 102 is a port or input connection for a power source (e.g., an alternating current (AC) power source). The power provided to the docking station 100 via the power interface 102 powers the internal components of the docking station 100 and is additionally provided to a coupled (i.e., "docked") mobile computing device to charge internal batteries of the mobile computing device and allow the mobile computing device to operate without draining the internal batteries.

The docking station 100 also includes a network interface 104. The network interface 104 is a port for a wired network connection such as Ethernet. Thus, a docked mobile device is able to use a network connection provided by the network interface 104 and communicate with local and wide area networks via the network interface 104.

The docking station 100 also includes one or more peripheral interfaces 106. Peripheral interfaces 106 are ports for coupling peripheral devices to the docking station 100 for use by a docked mobile device. Such peripheral devices include, for example, mice, keyboards, touch pads, track pads, audio output devices, network dongles, or other peripheral devices as can be appreciated. Examples of peripheral interfaces 106 include Universal Serial Bus (USB) ports, Thunderbolt™ ports, and the like.

The docking station 100 also includes one or more display interfaces 108. A display interface 108 allows for an external display or monitor to be coupled to the docking station for use by a docked mobile computing device. Examples of display interfaces 108 include, for example, Digital Visual Interface (DVI) ports, High-Definition Multimedia Interface™ (HDMI) ports, DisplayPort ports, and the like. In other words, video data from a docked mobile computing device is provided to an external display via the display interface 108 for display.

The docking station 100 also includes a docking interface 110. The docking interface 110 is a port, socket, cable, or other input/output interface that couples a mobile computing device to the docking station 100. The docking interface 110 provides data transfer to and from the docked mobile computing device and provides power to the docked mobile computing device. For example, input data from peripheral devices coupled to a peripheral interface 106 is provided to the docked mobile computing device via the docking interface 110. As another example, video data from the docked mobile computing device is provided to a display coupled to a display interface 108 via the docking interface 110. As a further example, network data to and from the mobile computing device is provided to and received from the network interface 104 via the docking interface 110. In other words, a mobile computing device is considered "docked" with the docking station 100 by virtue of being coupled to the docking station 100 via the docking interface 110.

The docking station 100 also includes one or more cooling elements 112. The cooling elements 112 are components that transfer or dissipate heat from a thermal interface 114, described in more detail below. The cooling elements 112 include, for example, heat pipes, vapor chambers, heat sinks, fans, liquid-cooling systems, or combinations thereof as can be appreciated.

The thermal interface 114 forms a thermal coupling between the cooling elements 112 of the docking station 100 and a cooling element of a docked mobile computing device. For example, in some implementations, the thermal interface 114 includes a portion of thermally conductive material such as copper. Accordingly, in some implementations, the thermal interface 114 is housed in a platform of the docking station 100 chassis (e.g., on an upper surface of the docking station 100 upon which a docked mobile computing device rests). In some implementations, the thermal interface 114 maintains a thermal coupling to the cooling elements 112 of the docking station 100 and forms a thermal interface to the cooling elements of the mobile computing device upon docking.

In some implementations, the thermal interface 114 includes a metal contact plate that contacts the cooling elements of a docked mobile computing device. Accordingly, in some implementations, a mobile computing device to be docked with the docking station 100 includes a thermal interface port that facilitates thermal coupling between the cooling element of the mobile computing device and the cooling element in the docking station. For example, in some implementations, the thermal interface port includes a mechanism to expose a portion of the internal cooling elements of the mobile computing device. In some implementations, the thermal interface port includes a sliding or hinged hatch or panel that exposes a portion of the internal cooling elements of the mobile computing device. In some implementations, the thermal interface port includes a moving panel that moves to expose the internal cooling elements of the mobile computing device using mechanical components of the docking station 100. Thus, the internal cooling elements are exposed on a docking event with the docking station 100, preventing accidental skin exposure or contact to potentially hot components of the cooling elements. Such exposed portions of the internal cooling elements of the mobile computing device include, for example, liquid-carrying pipes, heat pipes, a planar surface of a heat sink or vapor chamber, or other component. In some implementations, the thermal interface port exposes a metal plate or other thermal interface that provides a thermal coupling to a cooling element in the docking station.

In some implementations, the thermal interface 114 includes a portion of a thermal interface material such as a thermal pad. The thermal interface material fills air gaps between a conductive portion of the thermal interface 114 (e.g., a metal contact plate or other plate of conductive material) and the cooling element of the docked mobile computing device. For example, assume that the thermal interface 114 includes a metal contact plate that forms a thermal coupling to a metal plane surface of a heat sink exposed in the mobile computing device. In some configurations, the metal contact plate of the thermal interface 114 will not uniformly contact the metal plane surface of the heat sink, resulting in air gaps and poor thermal resistance. Accordingly, a thermal pad applied to the metal contact plate of the thermal interface 114 will fill air gaps to the metal plane surface of the heat sink, improving thermal conductivity.

In some implementations, the thermal interface 114 includes a fluid exchange interconnect that couples fluid lines of a cooling element in the docked mobile computing device to a liquid cooled cooling element 112 of the docking station 100. For example, the thermal interface 114 includes valves, gaskets, or other sealable fluid interchange devices that allow liquid to be transferred between a cooling element in the docked mobile computing device to the cooling element 112 in the docking station 100.

In some implementations, the cooling element 112 of the docking station 100 includes a thermoelectric cold plate that cools objects in contact with it. Accordingly, the thermoelectric cold plate will cool portions of the cooling element of the docked mobile computing device via the thermal interface 114. For example, assume that the mobile computing device includes heat pipes or liquid-flowing pipes that transfer heat to a heat sink to which the thermal interface 114 is thermally coupled. The thermoelectric cold plate will cool the heat sink of the mobile computing device via the thermal interface 114, thereby increasing the overall cooling capabilities of the mobile computing device. One skilled in the art will appreciate that, in some implementations, the thermal interface 114 is itself a surface of the thermoelectric cold plate. In other words, the thermoelectric cold plate serves as both the cooling element 112 and the thermal interface 114 by virtue of the thermoelectric cold plate making contact with the cooling elements of the mobile computing device.

In some implementations, the cooling element 112 of the docking station 100 includes a liquid-cooled system whereby liquid (e.g., water) carries heat to a heat sink, radiator fins, or other component that is exposed to air flow from a fan to dissipate the transferred heat. Accordingly, in some implementations, one or more segments of liquid-carrying piping contacts the thermal interface 114 in order to transfer heat from the thermal interface 114 via the liquid-cooled system. In some implementations, where the mobile computing device also implements a liquid-cooled system, when the mobile computing device is docked, a liquid-to-liquid heat exchanger is formed using the thermal interface and the liquid-cooled systems of both the docking station 100 and the mobile computing device.

A liquid-to-liquid heat exchanger is a system that transfers heat from one liquid to another via an intermediary metal plate. In this example, pipes of the liquid-cooled systems of both the docking station 100 and the mobile computing device contact the thermal interface 114 (serving as the intermediary metal plate). Pipes of the liquid-cooled system of the mobile computing device transfer their heat to the thermal interface 114, which then transfers the heat to the pipes of the liquid-cooled system of the docking station 100. The pipes of the docking station 100 then carry the heat to a heat sink, radiator, or other element for dissipating the heat (e.g., using one or more fans), thereby cooling the liquid in the pipes of the docking station 100. One skilled in the art will appreciate that, in some implementations, a liquid-cooled cooling element 112 of the docking station 100 will have a more powerful pump than is available for liquid-cooled mobile computing devices, providing further cooling advantages for the mobile computing device.

In some implementations, the cooling elements 112 include a heat sink or radiator fins thermally coupled to the thermal interface 114. In such an implementation, the cooling elements 112 also include one or more fans providing air flow over the heat sink or radiator fins. Thus, heat from the mobile computing device transfers to the heat sink or radiator fins via the thermal interface 114. Such heat is then dissipated using the one or more fans. In some implementations, the cooling elements 112 include one or more fans aligned with one or more vents of the mobile computing device. Such fans are operable to increase air flow into the mobile computing device, pull warm air out of the mobile computing device, or combinations thereof, depending on their direction of air flow.

One skilled in the art will appreciate that, in some implementations, the thermal interface 114 is included in the mobile computing device instead of the docking station 100. Accordingly, in some implementations, the portions of cooling elements 112 of the docking station 100 are exposed (e.g., exposed pipes, exposed heat sinks, exposed thermoelectric cold plates, and the like) such that the thermal interface 114 of the mobile computing device thermally couples to the cooling elements 112 on docking, thereby forming the thermal coupling between the cooling elements 112 of the docking station and the cooling elements of the mobile computing device via the thermal interface 114.

One skilled in the art will appreciate that, in some implementations, multiple thermal interfaces 114 are used to thermally couple the cooling elements 112 of the docking station and the cooling elements of the mobile computing device. As an example, both the docking station 100 and the mobile computing device include metal contact plates as thermal interfaces 114 thermally coupled to their respective cooling elements. By thermally coupling the thermal interfaces 114 of the docking station and the mobile computing device, the cooling elements 112 of the docking station and the cooling elements of the mobile computing device are thereby thermally coupled.

By thermally coupling the cooling elements of a mobile computing device and the cooling elements 112 of the docking station 100, heat is transferred from the mobile computing device to the docking station 100. This increases the overall cooling applied to the mobile computing device, increasing device reliability by reducing the risk of heat-induced component damage. Moreover, the performance capabilities of the mobile computing device are increased by virtue of the increased cooling, as the mobile computing device is able to perform greater overclocking or other performance boosting operations that increase the heat generated by the affected functional components.

Figure 2A:
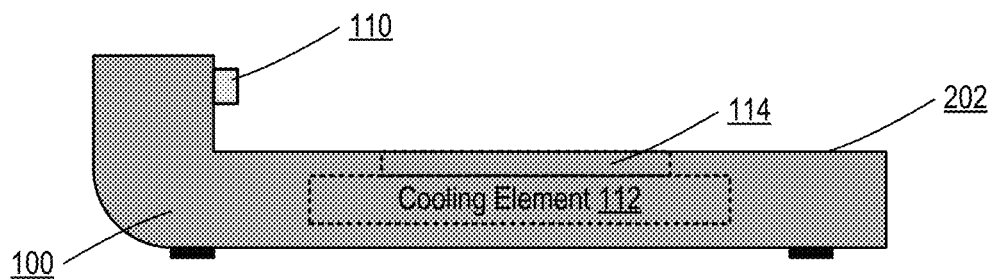
FIG. 2A is a diagram of an example view of a docking station for secondary external cooling for mobile computing devices according to some implementations.

For further explanation, FIG. 2A shows a profile view of an example docking station 100 for secondary external cooling for mobile computing devices according to some implementations of the present disclosure. As shown in the example view of FIG. 2A, the docking station 100 includes a docking platform 202 for supporting a docked mobile computing device. When docked (e.g., by coupling to the docking interface 110), the mobile computing device rests on the docking platform 202. In some implementations, when docked, the mobile computing device contacts the docking platform 202 and a thermal interface 114 housed in the docking platform 202. Thus, the weight of the mobile computing device resting on the docking platform 202 and thermal interface 114 provides the thermal coupling between the internal cooling elements 112 of the docking station and the cooling elements of the docked mobile computing device.

Figure 2B:
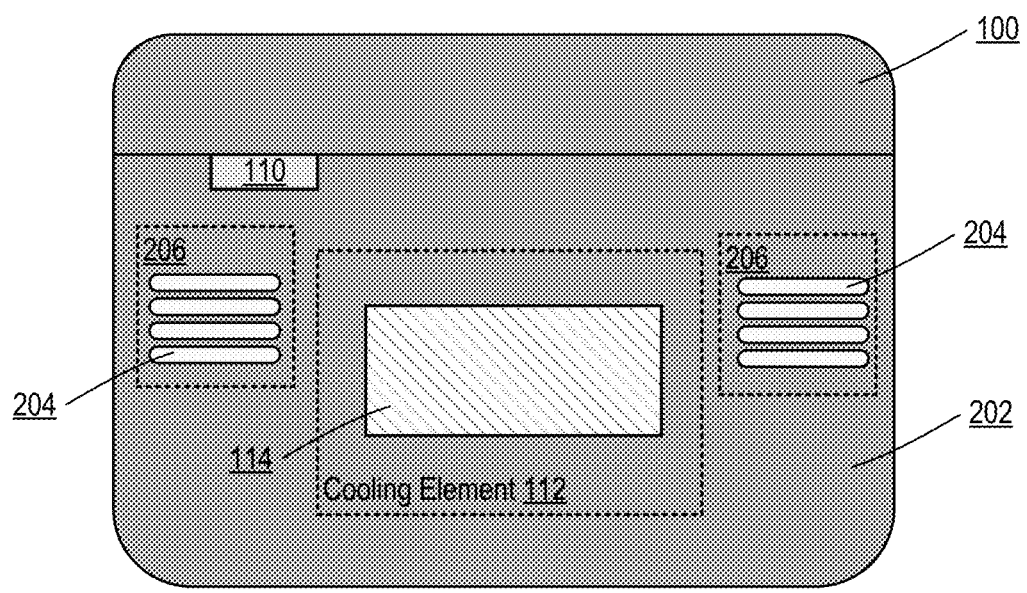
FIG. 2B is a diagram of another example view of a docking station for secondary external cooling for mobile computing devices according to some implementations.

For further explanation, FIG. 2B shows an overhead view of an example docking station 100 for secondary external cooling for mobile computing devices according to some implementations of the present disclosure. As shown in the example view of FIG. 2B, the thermal interface 114 is housed within the docking platform 202. In some implementations, the thermal interface 114 is substantially coplanar with a portion of a chassis of the docking station 100 that forms the docking platform 202.

As also shown in the example view of FIG. 2B, the docking station 100 includes vents 204. The vents 204 allow for air flow into and out of the interior of the docking station 100 chassis. Under the vents 204 are fans 206. Depending on the particular configuration of the fans 206, the fans 206 pull air into or push air out of the docking station 100 chassis. In some implementations, the vents 204 and fans 206 are aligned with one or more vents of a mobile computing device docked in the docking station 100. Accordingly, the fans 206 circulate air between the interior of the mobile computing device and the interior of the docking station 100. For example, cooled air from the interior of the docking station 100 is pushed into the interior of the mobile computing device. As another example, heated air from inside the mobile computing device is pulled into the docking station 100. One skilled in the art will appreciate that the particular placement of vents 204 and fans 206 is modifiable dependent on design and engineering considerations, including the particular mobile computing devices to be docked with the docking station and the placement of vents on the underside of such mobile computing devices.

One skilled in the art will appreciate that the particular shape of the docking station 100 as shown in FIGS. 2A and 2B is merely exemplary, and that other designs are contemplated within the scope of the present disclosure. Moreover, one skilled in the art will appreciate that the placement of particular elements, including the docking interface 110 and thermal interface 114 are modifiable depending on particular design and engineering configurations and that such configurations are also contemplated within the scope of the present disclosure.

Figure 3:
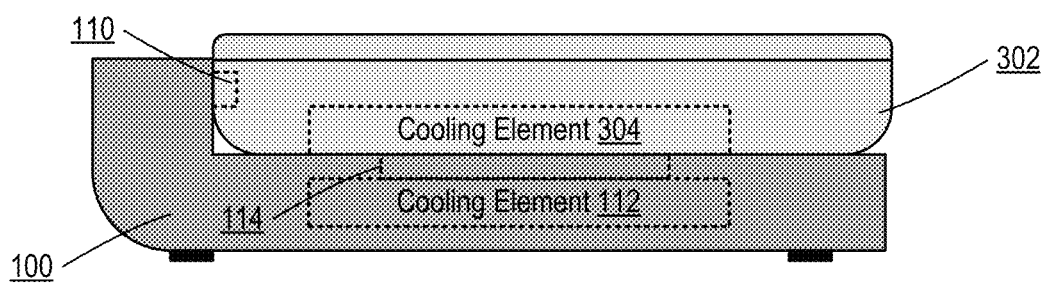
FIG. 3 is a diagram of an example view of a laptop docked with a docking station for secondary external cooling according to some implementations.

For further explanation, FIG. 3 sets forth a profile view of a mobile computing device in the form of a laptop 302 docked in an example docking station 100 secondary external cooling for mobile computing devices according to implementations of the present disclosure. In this example, the laptop 302 is docked with the docking station 100 via a coupling to the docking interface 110. By virtue of being docked with the docking station 100, a cooling element 304 of the laptop 302 is thermally coupled to a cooling element 112 of the laptop 302 via the thermal interface 114. Thus, while docked, heat from the interior of the laptop 302 is dissipated by the cooling element 304 into the cooling element 112 via the thermal interface 114, thereby increasing the cooling applied to the interior of the laptop 302.

Figure 4:
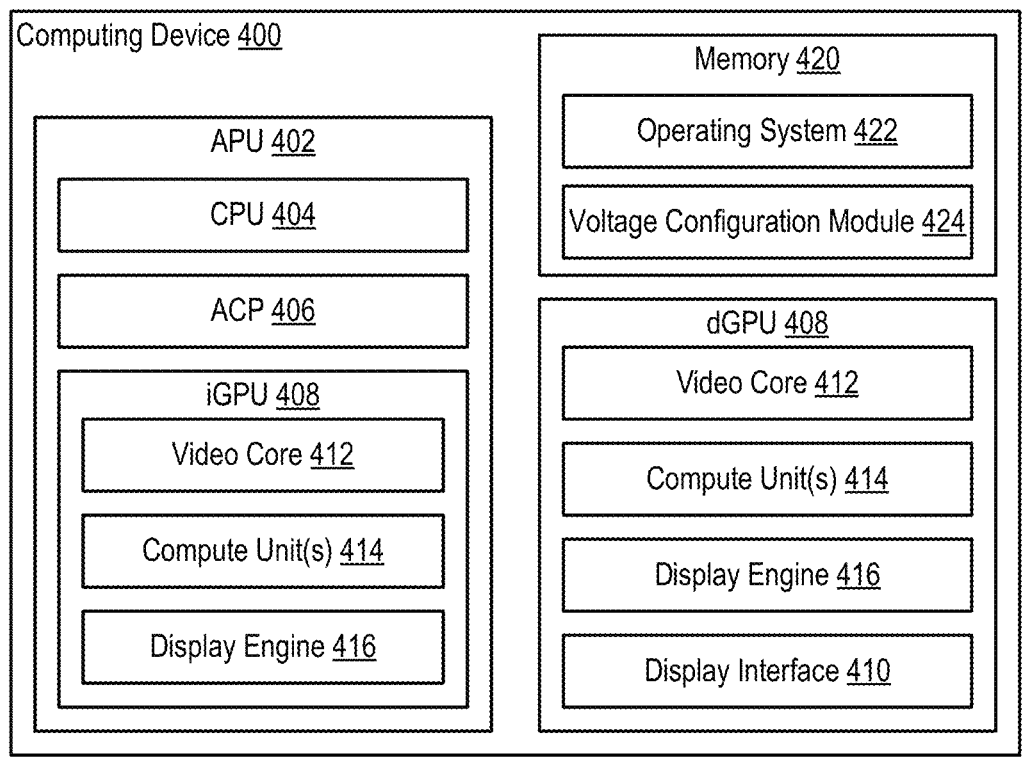
FIG. 4 is a block diagram of an example computing device that supports secondary external cooling according to some implementations.

FIG. 4 is a block diagram of a non-limiting example computing device 400 for secondary external cooling for mobile computing devices according to various implementations of the present disclosure. The example computing device 400 can be implemented as a variety of computing devices, including mobile devices, laptop computers, and the like. The computing device 400 includes an Accelerated Processing Unit (APU) 402. The APU 402 is a microprocessor that includes a central processing unit (CPU) 404 and integrated graphics processing unit (iGPU) 406 on a single die. The computing device 400 also includes a discrete graphics processing unit (dGPU) 408. Although the approaches set forth herein are described in the context of a computing device 400 including a dGPU 408 and an APU 402 with an iGPU 406, it is understood that the approaches set forth herein are applicable to any system or device incorporating both integrated and discrete GPUs.

The dGPU 408 is a peripheral or additional component of the computing device 400 operatively coupled to the APU 402. For example, in some implementations the dGPU 408 is operatively coupled to the APU 402 by a peripheral component interface express (PCIe) bus. Accordingly, in such an implementation, the dGPU 408 is installed in a PCIe port on a motherboard or other printed circuit board (PCB) into which the APU 402 is installed. By virtue of the operable connection between the APU 402 and the dGPU 408, the APU 402 is capable of issuing instructions, rendering jobs, and the like, to the dGPU 408.

In some implementations, the dGPU 408 includes a display interface 409. The display interface 409 is a port or socket to which an external monitor or display is connected. The display interface 409 provides a video signal to the external display for presentation. The display interface 409 includes, for example, a High Definition Multimedia Interface (HDMI) port, a Video Graphics Array (VGA) port, a Digital Visual Interface (DVI) port, a Universal Serial Bus C (USB-C) port, or other display port as can be appreciated.

The iGPU 406 and dGPU 408 each include one or more video cores 412. A video core 412 is a discrete processing unit, core, or other unit of hardware resources dedicated to encoding and decoding video data. For example, each video core 412 facilitates video encoding or decoding operations such as decoding streaming video content, encoding video for video conferencing applications, encoding video files for later playback, and the like.

The iGPU 406 and dGPU 408 also each include one or more compute units 414. Each compute unit 414 includes one or more cores that share a local cache, allowing for parallel processing and cache access for each core within a given compute unit 414. The compute units 414 facilitate various calculations and processing jobs submitted to the iGPU 406 and dGPU 408, including rendering operations, machine learning operations, and the like.

The iGPU 406 and dGPU 408 also each include a display engine 416. Each display engine 416 manages the presentation of video or image content to a display of the computing device 400 (e.g., an internal mobile device display or an external display coupled to a display interface 410). The APU 402 also includes an audio co-processor (ACP) 418. The ACP 418 is a core, processor, or other allocation of hardware components dedicated to audio encoding and decoding.

The computing device 400 also includes memory 420 such as Random Access Memory (RAM). Stored in memory 420 is an operating system 422 and a voltage configuration module 424. The operating system 422 and voltage configuration module 424 in the example of FIG. 4 are shown in memory 420, but many components of such software typically are stored in non-volatile memory also, such as, for example, on a disk drive or other storage medium. Operating systems 422 useful in the computing device 400 according to certain implementations include UNIX™, Linux™, Microsoft Windows™, and others as will occur to those of skill in the art.

The voltage configuration module 424 is a module for controlling the voltage allocated to the APU 402 and dGPU 408. For example, the voltage configuration module 424 implements technology to allocate voltage in order to increase performance for particular applications. Depending on the workload executed in the computing device 400, the voltage configuration module 424 increases or decreases the voltage used by the APU 402 and dGPU 408. As an example, for a workload that relies on the dGPU 408 heavily, such as complex graphics rendering, the voltage configuration module 424 will increase the voltage to the dGPU 408. As another example, for a workload that relies on the APU 402 more than the dGPU 408 such as audio encoding, or when the computing device 400 is in a low power consumption state, the voltage configuration module 424 will increase the voltage to the APU 402. In some implementations, an increase to the voltage of one component (e.g., to the APU 402 and dGPU 408) will cause or be performed in response to a decrease in the voltage of the other component.

In some implementations, a modification to the voltage of a given component will cause or be performed in response to a modification in operating frequency of the given component. For example, assume that a command or request is issued to increase the operating frequency of the dGPU 408 in response to a rendering job being submitted to the dGPU 408. The voltage configuration module 424 will then increase the voltage provided to the dGPU 408 so that the dGPU 408 is able to operate at the increased frequency. In some implementations, the frequency of a given component is defined according to a frequency-voltage curve. A frequency-voltage curve defines a relationship between the frequency of a component and its corresponding voltage. In other words, the frequency-voltage curve defines, for a given frequency, a corresponding voltage for the component.

One skilled in the art will appreciate that the voltage configuration module 424 operates within various constraints for voltages in the computing device 400. For example, in some implementations, the APU 402 and dGPU 408 have defined minimum and maximum safe voltages. One skilled in the art will appreciate that the particular voltage limits for the APU 402 and dGPU 408 are dependent on particular cooling and thermal solutions implemented in the computing device 400.

Furthermore, one skilled in the art will appreciate that when a computing device, such as the computing device 400 of FIG. 4, is docked with a docking station for secondary external cooling for mobile computing devices according to implementations of the present disclosure, the computing device 400 receives additional cooling by virtue of the thermal coupling to the cooling elements 112 when compared to an undocked state. Accordingly, the voltage configuration module 424 is able to modify voltages up to a higher maximum voltage by virtue of the increased cooling offsetting the increased heat generated by higher voltages. Accordingly, in some implementations, the voltage configuration module 424 is operable to modify a maximum safe operating voltage for one or more components (e.g., for the APU 402 or dGPU 408) in response to detecting that the computing device 400 is docked. For example, a connection to a docking interface 110 causes the computing device 400 to recognize that it is coupled to a docking station for secondary external cooling for mobile computing devices. In response, the voltage configuration module 424 increases one or more maximum safe operating voltage thresholds (e.g., the APU 402 or dGPU 408). Accordingly, in some implementations, the voltage configuration module 424 will reduce the one or more maximum safe operating voltage thresholds in response to a detected decoupling or disconnection event from the docking station 100.

Figure 5:
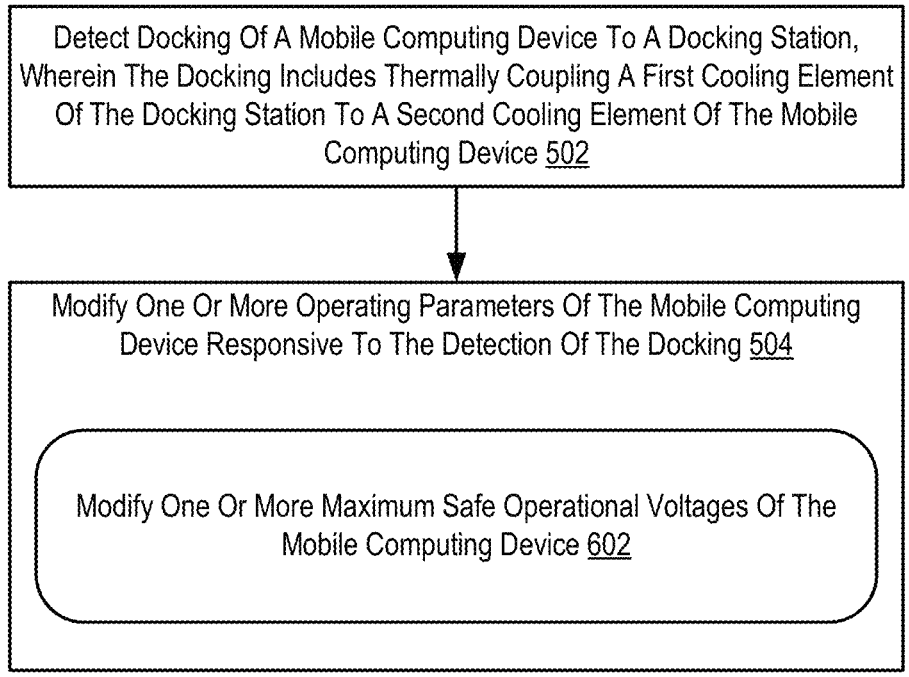
FIG. 5 is a flowchart of an example method for secondary external cooling for mobile computing devices according to some implementations.

For further explanation, FIG. 5 sets forth a flow chart illustrating an example method for secondary external cooling for mobile computing devices. The method of FIG. 5 includes detecting 502 docking of a mobile computing device to a docking station 100, where the docking station 100 includes thermally coupling a first cooling element 112 of the docking station 100 to a second cooling element 304 of a mobile computing device. In some implementations, the mobile computing device is docked with the docking station by virtue of a connection to a docking interface 110 of the docking station 100. The docking interface 110 is a port, socket, cable, or other input/output interface that couples a mobile computing device to the docking station 100. The docking interface 110 provides data transfer to and from the docked mobile computing device and provides power to the docked mobile computing device.

The first cooling element 112 includes components that transfer or dissipate heat from a thermal interface 114, described in more detail below. The first cooling element 112 includes, for example, heat pipes, vapor chambers, heat sinks, fans, liquid-cooling systems, or combinations thereof as can be appreciated. The second cooling element 304 transfers and dissipates heat from internal components of the mobile computing device to the thermal interface 114. In some implementations, the second cooling element 304 includes similar components as the first cooling element 112. For example, in some implementations, the first cooling element 112 and second cooling element 304 each include liquid-cooled systems. In other implementations, the first cooling element 112 and second cooling element 304 include different components. For example, the first cooling element 112 includes a thermoelectric cold plate while the second cooling element 304 includes heat pipes and a heat sink with radiator fins.

The thermal interface 114 forms a thermal coupling between the first cooling element 112 of the docking station 100 and a cooling element of a docked mobile computing device. For example, in some implementations, the thermal interface 114 includes a portion of a thermally conductive material such as copper. In some implementations, the thermal interface 114 is housed in a platform of the docking station 100 chassis (e.g., a docking platform 202) or other surface of a chassis of the docking station 100. In some implementations, the thermal interface 114 maintains a thermal coupling to the first cooling element 112 of the docking station 100 and forms a thermal interface to the second cooling element 304 of the mobile computing device upon docking.

In some implementations, the thermal interface 114 includes a metal contact plate that contacts the second cooling element 304 of a docked mobile computing device. Accordingly, in some implementations, a mobile computing device to be docked with the docking station 100 includes a mechanism to expose a portion of the internal second cooling element 304 of the mobile computing device. For example, the mobile computing device includes a sliding or hinged hatch or panel that exposes a portion of the internal second cooling element 304 of the mobile computing device. As another example, the mobile computing device includes a moving panel that moves to expose the internal second cooling element 304 of the mobile computing device using mechanical components of the docking station 100. Thus, the internal second cooling element 304 are exposed on a docking event with the docking station 100, preventing accidental skin exposure or contact to potentially hot components of the second cooling element 304. Such exposed portions of the internal second cooling element 304 of the mobile computing device include, for example, liquid-carrying pipes, heat pipes, a planar surface of a heat sink or vapor chamber, or other component.

In some implementations, the thermal interface 114 includes a portion of a thermal interface material such as a thermal pad. The thermal interface material fills air gaps between a conductive portion of the thermal interface 114 (e.g., a metal contact plate or other plate of conductive material) and the second cooling element 304 of the docked mobile computing device. For example, assume that the thermal interface 114 includes a metal contact plate that forms a thermal coupling to a metal plane surface of a heat sink exposed in the mobile computing device. In some configurations, the metal contact plate of the thermal interface 114 will not uniformly contact the metal plane surface of the heat sink, resulting in air gaps and poor thermal resistance. Accordingly, a thermal pad applied to the metal contact plate of the thermal interface 114 will fill air gaps to the metal plane surface of the heat sink, improving thermal conductivity.

In some implementations, the first cooling element 112 of the docking station 100 includes a thermoelectric cold plate that cools objects in contact with it. Accordingly, the thermoelectric cold plate will cool portions of the cooling element of the docked mobile computing device via the thermal interface 114. For example, assume that the mobile computing device includes heat pipes or liquid-flowing pipes that transfer heat to a heat sink to which the thermal interface 114 is thermally coupled. The thermoelectric cold plate will cool the heat sink of the mobile computing device via the thermal interface 114, thereby increasing the overall cooling capabilities of the mobile computing device. One skilled in the art will appreciate that, in some implementations, the thermal interface 114 is itself a surface of the thermoelectric cold plate. In other words, the thermoelectric cold plate serves as both the first cooling element 112 and the thermal interface 114 by virtue of the thermoelectric cold plate making contact with the second cooling element 304 of the mobile computing device.

In some implementations, the first cooling element 112 of the docking station 100 includes a liquid-cooled system whereby liquid (e.g., water) carries heat to a heat sink, radiator fins, or other component that is exposed to air flow from a fan to dissipate the transferred heat. Accordingly, in some implementations, one or more segments of liquid-carrying piping contacts the thermal interface 114 in order to transfer heat from the thermal interface 114 via the liquid-cooled system. In some implementations, where the mobile computing device also implements a liquid-cooled system as the second cooling element 304, when the mobile computing device is docked, a liquid-to-liquid heat exchanger is formed using the thermal interface and the liquid-cooled systems of both the docking station 100 and the mobile computing device.

A liquid-to-liquid heat exchanger is a system that transfers heat from one liquid to another via an intermediary metal plate. In this example, pipes of the liquid-cooled systems of both the docking station 100 and the mobile computing device contact the thermal interface 114 (serving as the intermediary metal plate). Pipes of the liquid-cooled system of the mobile computing device transfer their heat to the thermal interface 114, which then transfers the heat to the pipes of the liquid-cooled system of the docking station 100. The pipes of the docking station 100 then carry the heat to a heat sink, radiator, or other element for dissipating the heat (e.g., using one or more fans), thereby cooling the liquid in the pipes of the docking station 100. One skilled in the art will appreciate that, in some implementations, a liquid-cooled cooling element 112 of the docking station 100 will have a more powerful pump than is available for a liquid-cooled second cooling element 304 of mobile computing devices, providing further cooling advantages for the mobile computing device.

In some implementations, the first cooling element 112 includes a heat sink or radiator fins thermally coupled to the thermal interface 114. In such an implementation, the first cooling element 112 also includes one or more fans providing air flow over the heat sink or radiator fins. Thus, heat from the mobile computing device transfers to the heat sink or radiator fins via the thermal interface 114. Such heat is then dissipated using the one or more fans. In some implementations, the first cooling element 112 includes one or more fans aligned with one or more vents of the mobile computing device. Such fans are operable to increase air flow into the mobile computing device, pull warm air out of the mobile computing device, or combinations thereof, depending on their direction of air flow.

In some implementations, detecting 502 the docking is performed by a module of software executed in the mobile computing device. For example, a service, application, or portion of an operating system executed in the mobile computing device detects that the mobile computing device is connected to the particular docking station, and thus detects that a thermal coupling to a docking station 100 capable of cooling the mobile computing device has been performed. The docking station may include an agent implemented as software, hardware or combination of both that identifies the docking station as a docking station that provides secondary cooling. The module of the mobile computing device that detects the docking may either request the identification of the docking station from the agent or the agent may provide the identity to the module upon docking without a request.

One skilled in the art will appreciate that, in some implementations, the thermal interface 114 is included in the mobile computing device instead of the docking station 100. Accordingly, in some implementations, the portions of the first cooling element 112 of the docking station 100 are exposed (e.g., exposed pipes, exposed heat sinks, exposed thermoelectric cold plates, and the like) such that the thermal interface 114 of the mobile computing device thermally couples to the first cooling element 112 on docking. Upon such coupling of the thermal interface 114 of the mobile computing device to the first cooling element, a thermal coupling is formed between the cooling elements 112 of the docking station and the cooling elements of the mobile computing device via the thermal interface 114.

One skilled in the art will appreciate that, in some implementations, multiple thermal interfaces 114 are used to thermally couple the first cooling element 112 of the docking station and the cooling elements of the mobile computing device. As an example, both the docking station 100 and the mobile computing device include metal contact plates as thermal interfaces 114 thermally coupled to their respective cooling elements. By thermally coupling the thermal interfaces 114 of the docking station and the mobile computing device, the first cooling element 112 of the docking station and the cooling elements of the mobile computing device are thereby thermally coupled.

While docked with the docking station 100, in some implementations, the weight of the mobile computing device is supported by a chassis of the docking station 100 such that the mobile computing device rests on a docking platform 202 or other surface of the docking station 100. In such implementations, the weight of the mobile computing device facilitates contact between the mobile computing device and the thermal interface 114. In some implementations, additional mechanical components are included in the docking station 100 (e.g., clamps, clips, hooks, and the like) to increase the force contacting the mobile computing device to the docking station 100 and restrict movement of the mobile computing device.

The method of FIG. 5 also includes modifying 504 one or more operating parameters of the mobile computing device in response to the detection of the docking. For example, an operating system or other service with adequate permissions will modify various operational parameters of the mobile computing device due to the increased cooling provided by the docking station 100.

In some implementations, modifying (504) operating parameters of the mobile computing device includes modifying 602, in response to the mobile device being docked with the docking station 100, one or more maximum safe operational voltages of the mobile computing device. For example, a connection to a docking interface 110 causes the mobile computing device 400 to recognize that it is coupled to a docking station 100 for secondary external cooling for mobile computing devices. In response, a voltage configuration module 424 increases one or more maximum safe operating voltage thresholds (e.g., for the APU 402 or dGPU 408). Thus, the maximum safe operational voltages are increased as the increased heat generated by the components operating at higher voltage will be offset by the increased cooling capabilities afforded by the docking station.

In view of the explanations set forth above, readers will recognize that the benefits of secondary external cooling for mobile computing devices include:

Improved performance of a computing system by increasing the cooling applied to internal components of a computing device via a thermal coupling to a cooling element in a docking station.

Improved performance of a computing system by increasing the maximum safe operational voltages of components of computing devices coupled to a docking station for secondary external cooling for mobile computing devices due to the increased heat production being offset by the increased cooling capabilities.

Exemplary implementations of the present disclosure are described largely in the context of a fully functional computer system for secondary external cooling for mobile computing devices. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary implementations described in this specification are oriented to software installed and executing on computer hardware, nevertheless, alternative implementations implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some implementations, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to implementations of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various implementations of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A docking station for secondary external cooling for mobile computing devices, comprising:
    one or more ports for docking a mobile computing device, the mobile computing device including a first liquid-cooled system;
    a docking platform for supporting the mobile computing device;
    a cooling element comprising a second liquid-cooled system; and
    a thermal interface housed in the docking platform for transferring heat between the mobile computing device and the cooling element, wherein the first and second liquid-cooled systems include liquid that carries heat to be dissipated, and are thermally coupled via the thermal interface to form a liquid-to-liquid heat exchanger with the docked mobile computing device.

2. The docking station of claim 1, wherein the cooling element comprises a thermoelectric cold plate.

3. The docking station of claim 2, wherein the thermal interface comprises a surface of the thermoelectric cold plate.

4. The docking station of claim 1, wherein the cooling element comprises a liquid-cooled cooling element.

5. The docking station of claim 1, further comprising transferring heat between a liquid of the first liquid-cooled system and a liquid of the second liquid-cooled system.

6. The docking station of claim 1, further comprising one or more fans configured to provide air flow through the docking platform.

7. The docking station of claim 1, wherein the thermal interface comprises a metal contact plate.

8. A mobile computing device for secondary external cooling for mobile computing devices, comprising:
    a first cooling element comprising a first liquid-cooled system; and
    a thermal interface, wherein the mobile computing device is configured to thermally couple the first cooling element to a second cooling element of a docking station via the thermal interface, wherein the second cooling element comprises a second liquid-cooled system, and wherein the first and second liquid-cooled systems include liquid that carries heat to be dissipated, and form a liquid-to-liquid heat exchanger with the docked mobile computing device.

9. The mobile computing device of claim 8, wherein the mobile computing device is configured to expose the first cooling element to a thermal interface of the docking station.

10. The mobile computing device of claim 8, wherein the mobile computing device is configured to expose the thermal interface, wherein the thermal interface is housed in a chassis of the mobile computing device.

11. The mobile computing device of claim 10, wherein the thermal interface comprises a metal plate.

12. The mobile computing device of claim 8, wherein the first cooling element comprises a first liquid-cooled cooling element.

13. The mobile computing device of claim 12, wherein the second cooling element comprises a second liquid-cooled cooling element.

14. The mobile computing device of claim 8, further comprising transferring heat between a liquid of the first liquid-cooled system and a liquid of the second liquid-cooled system.

15. The mobile computing device of claim 8, and further comprising a fluid exchange interconnect.

16. The mobile computing device of claim 8, further comprising one or more vents aligned with one or more fans of the docking station.

17. A method for secondary external cooling for mobile computing devices, comprising:
- detecting docking of a mobile computing device to a docking station, wherein the docking includes thermally coupling a first cooling element of the docking station to a second cooling element of the mobile computing device, wherein the first and second cooling element each comprise a liquid-cooled system, and wherein the liquid-cooled systems include liquid that carries heat to be dissipated, and are thermally coupled via a thermal interface to form a liquid-to-liquid heat exchanger with the docked mobile computing device; and
- modifying one or more operating parameters of the mobile computing device responsive to the detection of the docking.

18. The method of claim 17, wherein modifying one or more operating parameters of the mobile computing device responsive to the detection of the docking further comprises modifying, in response to the mobile computing device being docked with the docking station, one or more maximum safe operational voltages of the mobile computing device.

19. The method of claim 17, further comprising transferring heat between liquids of each of the liquid-cooled systems.

20. The method of claim 18, wherein the first cooling element comprises a thermoelectric cold plate, and wherein modifying, in response to the mobile computing device being docked with the docking station, the one or more maximum safe operational voltages of the mobile computing device includes modifying one or more maximum safe operating voltage thresholds for a component within the mobile computing device.

* * * * *